United States Patent [19]

Yoshida et al.

[11] Patent Number: 4,743,527

[45] Date of Patent: May 10, 1988

[54] DRY PRESENSITIZED PLATE INCLUDING AN OVERLYING SILICONE RUBBER LAYER

[75] Inventors: Susumu Yoshida, Shizuoka; Hiroshi Takahashi, Fujieda; Hisashi Aoki; Kiyohiro Kondow, both of Annaka; Tetsuya Mayuzumi, Kawagoe, all of Japan

[73] Assignees: Fuji Photo Film Co., Ltd., Kanagawa; Shin-etsu Chemical Co., Ltd., Tokyo, both of Japan

[21] Appl. No.: 813,430

[22] Filed: Dec. 26, 1985

[30] Foreign Application Priority Data

Dec. 27, 1984 [JP] Japan .................................. 59-276507

[51] Int. Cl.$^4$ .......................... G03C 1/495; G03F 7/02
[52] U.S. Cl. .................................... 430/272; 430/275; 430/303
[58] Field of Search ......................... 430/272, 303, 275

[56] References Cited

U.S. PATENT DOCUMENTS 3,894,873  7/1975  Kobayashi et al. ............. 430/303 X
4,225,663  9/1980  Ball ...................................... 430/303
4,590,148  5/1986  Takahashi et al. ............. 430/272 X

FOREIGN PATENT DOCUMENTS 1444381  7/1976  United Kingdom ................ 430/303
1441610  7/1976  United Kingdom ................ 430/303

OTHER PUBLICATIONS

Gessner G. Hawley, ed, *The Condensed Chemical Dictionary*, Tenth Edition, Van Nostrand Reinhold Company Inc., New York, N.Y., 1981, pp. 920–921.

*Primary Examiner*—Paul R. Michl
*Assistant Examiner*—Cynthia Hamilton
*Attorney, Agent, or Firm*—Burns, Doane, Swecker & Mathis

[57] ABSTRACT

A presensitized plate for use in making a planographic printing plate requiring no dampening water which comprises a support having provided thereon, in order, a light-sensitive layer comprising a photodimerizable resin and a silicone rubber layer comprising an organopolysiloxane cured with a crosslinking agent comprising a reactive silane compound having a carbon-carbon double bond to which a silicon atom is not directly linked. The presensitized plate shows excellent developing properties and fine dot reproduction.

12 Claims, No Drawings

DRY PRESENSITIZED PLATE INCLUDING AN OVERLYING SILICONE RUBBER LAYER

BACKGROUND OF THE INVENTION

(1) FIELD OF THE INVENTION

This invention relates to a dry presensitized plate for use in making a dry planographic printing plate requiring no dampening water and having an overlying silicone rubber layer which acts as an ink repellent layer.

(2) DESCRIPTION OF THE PRIOR ART

There have been proposed various dry presensitized plates for use in making printing plates requiring no dampening water and having a silicone rubber layer which acts an ink repellent layer. For example, Japanese Patent Publication No. 54-26923 (British Patent 1,399,949) and Japanese Patent Publication No. 56-23150 disclose a presensitized plate comprising a support having provided thereon, in order, a photohardenable light-sensitive layer comprising a photopolymerizable composition and an overlying silicone rubber layer, and Japanese Patent Publication No. 55-22781 (British Patent 1,419,643 and German Patent 2,323,453) discloses one comprising a support having provided thereon, in order, a photohardenable light-sensitive layer comprising a photodimerizable resin and an overlying silicone rubber layer. Japanese patent application (opened to public inspection, hereinafter referred to as "OPI") No. 54-54702 discloses a presensitized plate comprising a light-sensitive layer of a photopolymerizable composition and an overlying silicone rubber layer comprising an organopolysiloxane and a vinyl triacyloxysilane. In last-mentioned presensitized plate, it is possible to reduce the content of ethylenic unsaturated monomer in the light-sensitive layer, and consequently to decrease deposition of printing paper powder, ink scum or dust on the light-sensitive layer and to produce non-image areas of the silicone rubber layer having increased adhesion strength to the light-sensitive layer and therefore non-image areas of the silicone rubber layer having high resistance to scratches during development or a press operation.

However, these types of presensitized plates have such properties that, depending on the circumstances, the silicone rubber layer is apt to adhere strongly to the photoadhesive light-sensitive layer as soon as it is provided on the light-sensitive layer. Therefore, when the presensitized plate is insufficiently developed after image-wise exposure, the silicone rubber layer in image areas is incompletely removed, so that the resulting dry printing plate is poor in fine dot reproduction. If the plate surface is too strongly rubbed during development in order to improve fine dot reproduction, the silicone rubber layer in non-image areas is damaged and the dry printing plate thus prepared is poor in printing properties, that is, it produces copies having background contamination and other defects. For avoiding this, it is necessary to lightly rub the plate surface with a soft developing pad, which prolongs the time required for development.

SUMMARY OF THE INVENTION

The inventors of this invention conducted various studies for overcoming the foregoing disadvantages of the prior art and they accomplished this invention which provides a presensitized plate for use in making a planographic printing plate requiring no dampening water which comprises a support having provided thereon, in order, a light-sensitive layer comprising a photodimerizable resin and a silicone rubber layer comprising an organopolysiloxane cured with a crosslinking agent comprising a reactive silane compound having a carbon-carbon double bond to which a silicon atom is not directly linked. The presensitized plate of this invention is good in developing properties and fine dot reproduction, i.e., it is easily developed to produce a dry planographic printing plate in which the silicone rubber layer is non-image areas is strongly adhered to the light-sensitive layer.

DETAILED DESCRIPTION OF THE INVENTION

A support which can be used in this invention must be flexible so that it can be installed in a printing machine and be resistant to loading at press operation. Typical examples of such a support include a metal plate such as aluminum, copper, steel, etc., a film or sheet of plastic such as polyethylene terephthalate, coated paper, rubber sheet, etc.

A composite support, a support having rubber elasticity or rubber elastic layer, and a cylindrical support can also be used in this invention.

For antihalation effect or other purposes, an undercoating layer can be provided on the support.

The light-sensitive layer of photodimerizable resin which can be used in this invention is such that the overlying silicone rubber layer adheres strongly thereto when irradiated with actinic light. The thickness of the light-sensitive layer is not particularly restricted provided that the layer is uniformly applied to the support, but it is preferably in the range of 0.05 to 100 microns, and more preferably 0.1 to 10 microns. If necessary, an anchor coat or an adhesion layer can be provided between the support and the light-sensitive layer for increasing the adhesion between them or for antihalation.

The photodimerizable resins which can be used in this invention includes polyesters, polycarbonates, polyamides, polyacrylates and polyvinylalcohol derivatives, having, at a main or side chain, a group represented by

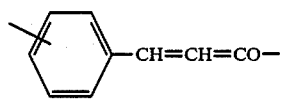

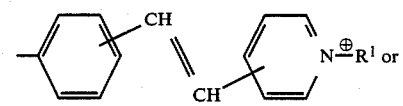

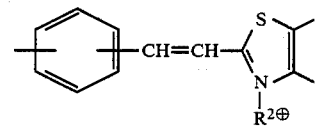

wherein $R^1$ and $R^2$ represent an alkyl having 1 to 10 carbon atoms. The molecular weight of these resins is not particularly restricted as long as the resins are soluble in a solvent, but it is ordinarily advantageous that it be selected in the range of one thousand to tens of thousands. Preferred examples of such polymer include a light-sensitive polymer having a light-sensitive group at a main chain, e.g., a light-sensitive polyester derived from p-phenylene diacrylic acid and an diol disclosed in U.S. Pat. Nos. 3,030,208 and 3,707,373; a light-sensitive polymer, e.g., a light-sensitive polyester derived from a 2-properidene malonic acid compound such as cinnamylidene malonic acid and a bifunctional glycol disclosed in U.S. Pat. Nos. 2,956,878 and 3,173,787; and a light-sensitive polymer such as a cinnamate of a hydroxy group-containing polymer such as polyvinyl alcohol, starch, cellulose and an analogue thereof disclosed in U.S. Pat. Nos. 2,690,966, 2,752,372 and 2,732,301, all of which are insolubilized by the irradiation of actinic light.

A photosensitizers which can be incorporated in the light-sensitive layer of this invention include those disclosed in U.S. Pat. Nos. 2,610,120, 2,670,285, 2,670,286, 2,670,287, 2,690,966, 2,732,301, 2,835,656, 2,956,878, 3,023,100, 3,066,117, 3,141,770, 3,173,787, 3,357,831, 3,409,593, 3,418,295, 3,453,110, 3,475,617, 3,561,969, 3,575,929, 3,582,327, 3,647,470, 3,721,566 and 3,737,319. Specific examples of particularly useful photosensitizers include 2-benzoylmethylene-1-methyl-beta-naphthothiazoline, 5-nitro-acenaphthene, beta-chloroanthraquinone, 1,2-benzalanthraquinone, p,p'-tetraethyldiaminodiphenyl ketone, p,p'-dimethylaminobenzophenone and 4-nitro-2-chloroaniline. The photosensitizer is used preferably in an amount of 0.5 to 15 percent by weight, and particularly 2 to 8 percent by weight based on the weight of the light-sensitive polymer.

In addition to the foregoing photosensitizer, one or more of the following photosensitizers can be incorporated for accelerating the light-adhesion between the light-sensitive layer and the silicone rubber layer: (1) vicinal polyketaldonyl compounds disclosed in U.S. Pat. No. 2,367,660, (2) alpha-carbonyl alcohol compounds disclosed in U.S. Pat. Nos. 2,367,661 and 2,367,670, (3) acyloinether compounds disclosed in U.S. Pat. No. 2,448,828, (4) aromatic acyloin compounds substituted by a hydrocarbon group at alpha-position disclosed in U.S. Pat. No. 2,722,512 and polynuclear quinone compounds disclosed in U.S. Pat. Nos. 3,046,127 and 2,951,758, (5) combinations of triarylimidazole dimer and p-aminophenyl ketone disclosed in U.S. Pat. No. 3,549,367, (6) benzothiazole compounds disclosed in U.S. Pat. No. 3,870,524, (7) combinations of benzothiazol compounds and trihalomethyl-s-triazine compounds disclosed in U.S. Pat. No. 4,239,850, (8) acridine and phenazine compounds disclosed in U.S. Pat. No. 3,751,259 and (9) oxadiazole compounds disclosed in U.S. Pat. No. 4,212,970.

In addition to the foregoing components, if necessary, an additive such as a dye, a pigment, a plasticizer and a polymerization inhibitor can be incorporated in the light-sensitive layer.

The silicone rubber composition which can be used to make a silicone rubber layer in this invention comprises, as a major component, linear organopolysiloxane having a molecular weight of 2,000 to 900,000 and the following repeating unit:

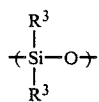

wherein $R^3$ is an alkyl or phenyl group having 1 to 10 carbon atoms, and preferably more than 60% of $R^3$ group is methyl.

Such a linear organopolysiloxane is mixed with a reactive crosslinking agent to form a crosslinked silicone rubber. Crosslinking agents used in a room-temperature vulcanizing-silicone rubber include a silane such as an acetoxysilane, a ketoximesilane, an aminosilane, an amidosilane, an alkoxysilane and a vinyloxysilane, and an organo-hydrogen polysiloxane. The crosslinking agent reacts with a terminal hydroxy group of the linear organopolysiloxane to form a crosslinked silicone rubber. Such crosslinking agents are preferably used in an amount of 1 to 20 percent by weight based on the weight of the linear organopolysiloxane.

This invention is characterized in that all or part of the crosslinking agent conventionally used to cure the silicone rubber composition is replaced by the reactive silane compound having a carbon-carbon double bond to which a silicon atom is not directly linked, to thereby obtain a dry presensitized plate which is good in fine dot reproduction.

The inventors of this invention have also studied a reactive silane compound having a carbon-carbon double bond to which a silicon atom is directly linked.

They found that when there is used a silicone rubber composition which makes strong adhesion to a light-sensitive layer when it is applied thereon, as disclosed in Japanese patent application (OPI) No. 54-54702, the presensitized plate thus obtained is poor in developing properties and fine dot reproduction, and that when there is used a silicone rubber composition which does not make strong adhesion to a light-sensitive layer when it is applied thereon, sufficient photoadhesion as obtained by this invention cannot be obtained and the silicone rubber layer in non-image areas is partly removed during development. The reactive silane compound having a carbon-carbon double bond to which a silicon atom is directly linked cannot make sufficient photoadhesion because the reactivity of the carbon-carbon double bond is greatly impaired by steric hindrance. To the contrary, the reactive silane compound used in this invention and having a carbon-carbon double bond to which a silicon atom is not directly attached but is attached through at least one atom can easily make sufficient photoadhesion because the carbon-carbon double bond is relatively mobile and consequently easy to react with the photoadhesive light-sensitive layer. The reactive silane compound having a carbon-carbon double bond to which a silicon atom is not directly linked is used preferably in an amount of 1 to 15 percent by weight based on the weight of the linear organopolysiloxane.

Particularly preferred examples of the reactive silane compound used in this invention and having a carbon-carbon double bond to which a silicon atom is not directly linked are represented by the formula:

wherein $R^1$ represents a hydrogen atom or an alkyl group having 1 to 3 carbon atoms, $R^2$ represents a bivalent linkage group comprising one or more carbon, oxygen or nitrogen atoms, such as $-COOC_3H_6-$, $-CONHC_3H_6-$, $-COOCH_2CH(OH)CH_2OC_3H_6-$, $-CH_2-$, $-C_2H_4-$ and $-C_3H_6-$, $R^3$ represents an alkyl group having 1 to 3 carbon atoms or a phenyl group, X represents a hydrolyzable group such as $-OR^4$, $-OCOR^4$,

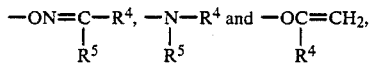

wherein $R^4$ and $R^5$ may be the same or different and represent substituted or unsubstituted alkyl group, and n is an integer of 0 to 3.

The silicone rubber composition used to make a silicone rubber layer in this invention ordinarily contains as a catalyst a small amount of an organic carboxylic acid metal salt such as a salt of tin, zinc or lead. A reinforcing filler can be added to the silicone rubber composition in an amount of 0 to 300 percent by weight. The same photosensitizer as contained in the light-sensitive layer can be contained in the silcone rubber composition.

The silicone rubber composition is applied to the light-sensitive layer to form a silicone rubber layer.

For purposes of protection of the silicone rubber layer thus prepared, there can be laminated thereon a thin, plain or embossed protective film or sheet of polyethylene terephthalate, polyethylene, polypropylene, polystyrene, polyvinylchloride, polyvinylidenechloride, cellophane, etc. Such protective film may be removed before image-wise exposure. Alternatively, it is unnecessary to remove the protective film before image-wise exposure if the film adequately transmits ultraviolet light and has a thickness of below 100 microns, and preferably below 30 microns so that image sharpness is not damaged.

The dry presensitized plate of this invention comprises a support having provided thereon, in order, an optional adhesive or primer layer, a light-sensitive layer, a silicone rubber layer, and an optional protective layer. The silicone rubber layer should be as thin as possible for good tone reproduction but should have some degree of thickness for good durability in printing and for avoiding scumming or tinting. Its thickness, therefore, is preferably 0.5 to 10 microns, and more preferably 1.0 to 3.0 microns. The primer layer and the adhesive layer should also be as thin as possible insofar as they are able to fulfill their functions.

The presensitized plate of this invention is exposed to light through a positive transparency and then developed by a developer which dissolves the light-sensitive layer in image (i.e. unexposed) areas to remove the light-sensitive layer and the overlying silicone rubber layer in image areas (Type I), or by a developer which swells selectively the silicone rubber layer only in image areas to remove only the silicone rubber layer in image areas (Type II). By one or the other method described above, a dry planographic printing plate requiring no dampening water can be prepared.

As a developer for the presensitized plate of this invention, there can be used those for the development of conventional dry presensitized plate. For example, there can preferably be used aliphatic hydrocarbons (e.g., hexane, heptane, Iso Par E, H and G (Trademarks of aliphatic hydrocarbons produced by EXXON CHEMICALS IND. INC.), gasoline and kerosene), aromatic hydrocarbons (e.g., toluene and xylene), or halogenated hydrocarbons (e.g., trichloroethylene) to which the following polar solvent has been added: water, alcohols (e.g., methanol and ethanol), ethers (e.g., methyl cellosolve, ethyl cellosolve, butyl cellosolve, methyl carbitol, ethyl carbitol, butyl carbitol and dioxane), ketones (e.g., acetone and methyl ethyl ketone) and esters (e.g., ethyl acetate, methyl cellosolve acetate, cellosolve acetate and carbitol acetate).

A dye such as Crystal Violet or Astrazone Red can be added to the developer to dye image areas during development.

Development can be carried out in a conventional manner, for example, by rubbing the image-wise exposed plate with a developing pad which had been soaked in the aforementioned developer or by pouring the developer on the exposed plate and then rubbing it with a developing brush.

By development, in the Type I plate, the silicone rubber layer and the light-sensitive layer in image areas are removed and the surface of the support or the primer layer in the corresponding areas is exposed to provide ink receiving areas, and in the Type II plate, only the silicone rubber layer in image areas is removed and the surface of the light-sensitive layer in the corresponding areas is exposed to provide ink receiving areas.

The dry presensitized plate of this invention has improved developing properties and fine dot reproduction as compared with the dry presensitized plate of the prior art wherein the silicone rubber layer strongly adheres to the light-sensitive layer even before exposure, and it provides a dry planographic printing plate in which the silicone rubber layer in non-image areas strongly adheres to the light-sensitive layer.

EXAMPLES

This invention will be explained in detail referring to the following EXAMPLES.

EXAMPLE 1

A smooth aluminum plate degreased in a conventional manner was coated with the primer of the following composition in an amount of 0.5 g/m² (dry weight) and dried.

| | parts by weight |
|---|---|
| Light-sensitive unsaturated polyester obtained by a polycondensation of p-phenylenediacrylic acid ester and 1,4-dihydroxyethyloxycyclohexane (1/1 mole ratio) | 10 |
| 1-Methyl-2-benzoylmethylene-beta-naphthothiazoline | 0.6 |
| N—beta-aminoethyl-gamma-aminopropyl trimethoxy silane (silane coupling agent KBM-603 produced by SHINETSU CHEMICAL CO LTD.) | 0.5 |
| Methyl cellosolve acetate | 150 |
| Toluene | 150 |
| Methyl cellosolve | 150 |

The aluminum plate coated with the composition was exposed for 30 counts using an ET 26 V UDNS ULTRA-PLUS FLIP-TOP PLATE MAKER (produced by nu ARC IND. INC.). The resulting primer coating did not dissolve in the developing solution or in a mixed solvent (methyl cellosolve acetate/toluene=2/1 (by weight)) for coating the light-sensitive composition when it was immersed therein.

The following light-sensitive composition was coated on the primer coating in an amount of 0.25 g/m² (dry weight) and dried.

|                                                                                                                               | parts by weight |
| ----------------------------------------------------------------------------------------------------------------------------- | --------------- |
| Light-sensitive unsaturated polyester obtained by a polycondensation of p-phenylene diacrylic acid ester and 1,4-dihydroxyethyloxycyclohexane (1/1 mole ratio) | 10              |
| 1-Methyl-2-benzoylmethylene-beta-naphthothiazoline                                                                            | 0.6             |
| MICROLITH BLUE 4GK (phthalocyanine blue pigment produced by CIBA-GEIGY CO.)                                                   | 2               |
| Methyl cellosolve acetate                                                                                                     | 600             |
| Toluene                                                                                                                       | 300             |

On the resulting light-sensitive layer, the following silicone rubber composition was coated in an amount of 2.0 g/m$^2$ (dry weight) and dried to obtain a silicone rubber layer.

|                                                                                                         | parts by weight |
| ------------------------------------------------------------------------------------------------------- | --------------- |
| Dimethyl polysiloxane having hydroxy group at both terminal ends (molecular weight of about 600,000)    | 100             |
| Methyl hydrogen polysiloxane having trimethylsilyl group at both terminal ends (molecular weight of about 2,500) | 3.5             |
| Gamma-methacryloxypropyl trimethoxysilane                                                               | 10              |
| Dibutyl tin dioctoate                                                                                   | 2               |
| Iso Par G (produced by EXXON CHEMICALS IND. INC.)                                                       | 2,000           |

The silicone rubber layer thus obtained was peeled from the light-sensitive layer by strongly rubbing it with the finger. However, a protective layer of a 12 micron thick polypropylene film was laminated on the silicone rubber layer using FIRST ELECTRONIC LAMINATOR (produced by DAI-ICHI DENSHI KOGYO) and a presensitized plate which can practically be used was obtained. The presensitized plate was exposed for 30 counts through a positive transparency and a test chart, i.e. PLAIN CONTROL WEDGE PCW (produced by GRETAG CO.) in close contact therewith using the plate maker produced by nu ARC IND. INC. and then the laminated film was peeled off. The exposed plate was immersed for one minute in a developer consisting of 90 parts by weight of Iso Par G (produced by EXXON CHEMICALS IND. INC.), 7 parts by weight of diethyleneglycol monobutyl ether, 3 parts by weight of diethyleneglycol monoethyl ether and 5 parts by weight of diethyl succinate and then lightly rubbed with a developing pad. The light-sensitive layer and the silicone rubber layer in unexposed areas were quickly removed.

As described earlier, the adhesion strength between the silicone rubber layer and the light-sensitive layer was very weak in unexposed (image) areas of this plate but it was very strong in exposed (non-image) areas and resistant to a printing operation. The dry printing plate thus prepared was set on a printing machine (HEIDELBERG GTO) from which the water feeder had been removed. Printing was carried out using SUMI ink, TOYO KING ULTRA TUK AQUALESS G produced by TOYO INK CO. All of steps 1 to 12 (halftone dot area of 4 to 96%) were reproduced in a half-tone step wedge of 120 lines/cm screen ruling and 30,000 copies having no background contamination were obtained.

COMPARATIVE EXAMPLE 1

On the same aluminum support as in EXAMPLE 1, a primer layer and a light-sensitive layer were provided in the same manner as in EXAMPLE 1. On the light-sensitive layer, there was applied a silicone rubber composition of the following formulation in an amount of 2.0 g/m$^2$ (dry weight) and dried.

|                                                                                                         | parts by weight |
| ------------------------------------------------------------------------------------------------------- | --------------- |
| Dimethyl polysiloxane having hydroxy group at both terminal ends (molecular weight of about 600,000)    | 100             |
| Methyl hydrogen polysiloxane having trimethylsilyl group at both terminal ends (molecular weight of about 2,500) | 3.5             |
| N—beta-(aminoethyl)-gamma-aminopropyl trimethoxysilane                                                  | 1               |
| Dibutyl tin dioctoate                                                                                   | 2               |
| Iso Par G                                                                                               | 2,000           |

The silicone rubber layer adhered strongly to the light sensitive layer as soon as it was formed thereon.

In the same manner as in EXAMPLE 1, a polypropylene film was laminated on the silicone rubber layer and the performance of the presensitized plate thus prepared was evaluated. The results are as shown in Table 1.

COMPARATIVE EXAMPLE 2

On the same aluminum support as in EXAMPLE 1, a primer layer and a light-sensitive layer were provided in the same manner as in EXAMPLE 1. On the light-sensitive layer, there was applied a silicone rubber composition of the following formulation in an amount of 2.0 g/m$^2$ (dry weight) and dried.

|                                                                                                         | parts by weight |
| ------------------------------------------------------------------------------------------------------- | --------------- |
| Dimethyl polysiloxane having hydroxy group at both terminal ends (molecular weight of about 600,000)    | 100             |
| Methyl hydrogen polysiloxane having trimethylsilyl group at both terminal ends (molecular weight of about 2,500) | 3.5             |
| Vinyl triacetoxysilane                                                                                  | 4               |
| Dibutyl tin dioctoate                                                                                   | 2               |
| Iso Par G                                                                                               | 2,000           |

The silicone rubber layer of the presensitized plate, similarly to that obtained by COMPARATIVE EXAMPLE 1, adhered strongly to the light sensitive layer as soon as it was formed thereon.

In the same manner as in EXAMPLE 1, a polypropylene film was laminated on the silicone rubber layer and the performance of the presensitized plate thus prepared was evaluated. The results are as shown in Table 1.

COMPARATIVE EXAMPLE 3

On the same aluminum support as in EXAMPLE 1, a primer layer and a light-sensitive layer were provided in the same manner as in EXAMPLE 1. On the light-sensitive layer, there was applied a silicone rubber composition of the following formulation in an amount of 2.0 g/m$^2$ (dry weight) and dried.

| | parts by weight |
|---|---|
| Dimethyl polysiloxane having hydroxy group at both terminal ends (molecular weight of about 600,000) | 100 |
| Methyl hydrogen polysiloxane having trimethylsilyl group at both terminal ends (molecular weight of about 2,500) | 3.5 |
| Vinyl trimethoxysilane | 6 |
| Dibutyl tin dioctoate | 2 |
| Iso Par G | 2,000 |

The silicone rubber layer adhered weakly to the light-sensitive layer and it was removed from the light-sensitive layer when it was strongly rubbed with the finger in the same manner as in EXAMPLE 1.

A polypropylene film was laminated on the silicone rubber layer, in the same manner as in EXAMPLE 1, and the performance of the presensitized plate thus prepared was evaluated. The results are as shown in Table 1. The photoadhesion strength increased but the silicone rubber layer in non-image areas was partly removed during development.

| | parts by weight |
|---|---|
| Toluene | 300 |

On the resulting light-sensitive layer, the following silicone rubber composition was coated in an amount of 2.5 g/m² (dry weight) and dried to obtain a silicone rubber layer.

| | parts by weight |
|---|---|
| Dimethyl polysiloxane having hydroxy group at both terminal ends (molecular weight of about 600,000) | 100 |
| Methyl hydrogen polysiloxane having trimethylsilyl group at both terminal ends (molecular weight of about 2,500) | 3.5 |
| Gamma-methacryloxypropyl trimethoxysilane | 15 |
| Dibutyl tin diacetate | 2 |
| Iso Par G (Produced by EXXON CHEMICALS IND. INC.) | 1,600 |

TABLE 1

| | Adhesion strength of the silicone rubber larger | | Developing* speed | Dot reproduction** |
|---|---|---|---|---|
| | Before exposure | After exposure | (Second) | (120 lines) |
| EXAMPLE 1 gamma-methacryloxy-propyl trimethoxy-silane | weak | strong | 60 | 4–96% |
| COMPARATIVE EXAMPLE 1 N—beta-aminoethyl-gamma-aminoproyl trimethoxysilane | strong | strong | 120 | 24–96% |
| COMPARATIVE EXAMPLE 2 vinyl triacetoxy-silane | strong | strong | 100 | 24–96% |
| COMPARATIVE EXAMPLE 3 vinyl trimethoxy-silane | weak | strong | The silicone rubber layer was peeled off. | — |

*Developing speed: The time required for manually developing a plate having the size of 450 mm × 370 mm.
**Dot reproduction: The range of halftone dot area reproduced when a plate is exposed through a halftone step wedge of 120 lines/cm screen ruling.

EXAMPLE 2

In the same manner as in EXAMPLE 1, there was provided on an aluminum plate a primer layer, on which a light-sensitive composition having the following formulation was applied in an amount of 0.3 g/m² (dry weight) and dried.

| | parts by weight |
|---|---|
| Polyvinyl cinnamate KPB (produced by EASTMAN KODAK CO.) | 100 |
| Methyl cellosolve acetate | 500 |
| Light-sensitive unsaturated polyester obtained by a polycondensation of p-phenylene diacrylic acid ester and 1,4-dihydroxyethyloxycyclohexane (1/1 mole ratio) | 10 |
| 1-Methyl-2-benzoylmethylene-beta-naphthotiazoline | 0.6 |
| MICROLITH BLUE 4GK (phthalocyanine blue pigment produced by CIBA-GEIGY CO.) | 2 |
| Methyl cellosolve acetate | 600 |

In the same manner as in EXAMPLE 1, the presensitized plate thus prepared was covered with a polypropylene film, image-wise exposed and developed. A dry printing plate having excellent developing properties and dot reproduction was obtained. Printing was conducted using the printing plate and 10,000 copies having no contamination were obtained.

EXAMPLE 3

A 0.24 mm thick aluminum plate was grained with a nylon brush and an aqueous suspension of 400 mesh pumice powder, washed with water, etched in a 10 percent by weight solution of sodium hydroxide in water at 70° C. for 60 seconds, washed with flowing water, neutralized with a 20 percent by weight solution of nitric acid in water, washed with water and electrolytically grained according to an electrolytical graining method as described in Japanese patent application (OPI) No. 53-67507, i.e., in a one percent by weight solution of nitric acid in water at 160 Coulomb/dm² using a sinusoidal current ($V_A=12.7$ V, $Vc=9.1$ V).

The plate was then desmatted in a 30 percent by weight solution of sulfuric acid in water at 55° C. for 2 minutes and anodized in a 7% sulfuric acid solution so as to obtain an anodized aluminum layer of 2.0 g/m² in thickness. The plate thus obtained was coated with the following light-sensitive composition in an amount of 1.5 g/m² (dry weight) and dried.

|  | parts by weight |
|---|---|
| Light-sensitive unsaturated polyester obtained by a polycondensation of p-phenylene diacrylic acid ester and 1,4-dihydroxyethyloxycyclohexane (1/1 mole ratio) | 10 |
| 1-Methyl-2-benzoylmethylene-beta-naphthothiazoline | 0.6 |
| MICROLITH BLUE 4GK (phthalocyanine blue pigment produced by CIBA-GEIGY CO.) | 1 |
| Methyl cellosolve acetate | 70 |
| Toluene | 35 |

On the resulting light-sensitive layer, the same silicone rubber composition as in EXAMPLE 1 was coated in an amount of 2.0 g/m² (dry weight) and dried to obtain a silicone rubber layer.

A protective layer of a 9 micron thick polypropylene film was laminated on the silicone rubber layer in the same manner as in EXAMPLE 1.

The dry presensitized plate thus obtained was exposed in the same manner as in EXAMPLE 1 through a positive transparency in close contact therewith, and then the laminated film was peeled off. Development was carried out using the following developer. The silicone rubber layer only in unexposed (image) areas was quickly removed.

|  | parts by weight |
|---|---|
| Iso Par H (produced by EXXON CHEMICALS) | 100 |
| Diethyleneglycol monobutylether | 10 |
| Dibutyl succinate | 5 |

Printing was conducted using this dry printing plate in the same manner as in EXAMPLE 1. Copies having excellent reproduction in highlight areas were obtained.

What is claimed is:

1. A presensitized plate for use in making a planographic printing plate requiring no dampening water which comprises a metal support having provided thereon, in order, a light-sensitive layer comprising a photodimerizable resin and a silicone rubber layer comprising an organo-polysiloxane cured with a crosslinking agent comprising a combination of an organohydrogen polysiloxane with a reactive silane compound having a carbon-carbon double bond to which a silicon atom is not directly linked.

2. The presensitized plate of claim 1, wherein said reactive silane compound is represented by the formula:

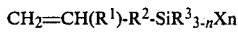

wherein $R^1$ is hydrogen atom or an alkyl group having 1 to 3 carbon atoms, $R^2$ is a bivalent linkage group, $R^3$ is an alkyl group having 1 to 3 carbon atoms or a phenyl group, X is a hydrolyzable group and n is an integer of 0 to 3.

3. The presensitized plate of claim 1, wherein said reactive silane compound is present in an amount of 1 to 15 percent by weight based on the weight of the organopolysiloxane.

4. The presensitized plate of claim 1, wherein a primer layer is provided between said support and said light-sensitive layer.

5. The presensitized plate of claim 1, wherein said organopolysiloxane has a molecular weight of 2,000 to 900,000 and the following repeating unit:

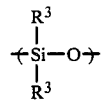

wherein $R^3$ is an alkyl or phenyl group having 1 to 10 carbon atoms.

6. The presensitized plate of claim 5, wherein more than 60% of $R^3$ group is methyl.

7. The presensitized plate of claim 1, wherein said photodimerizable resin is comprised of at least one main or side chain selected from the group consisting of

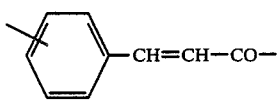

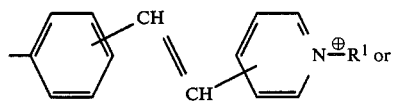

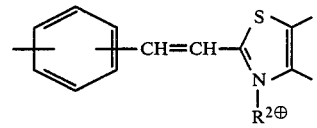

wherein $R^1$ and $R^2$ represent an alkyl having 1 to 10 carbon atoms.

8. The presensitized plate of claim 1, wherein said light-sensitive layer contains a photosensitizer in an amount of 0.5 to 15 percent by weight based on the weight of said photodimerizable resin.

9. The presensitized plate of claim 1, wherein said photodimerizable resin is selected from the group consisting of a light-sensitive polyester derived from p-phenylene diacrylic acid and a diol, a light-sensitive polyester derived from a 2-properidene malonic acid compound and a bifunctional glycol, and a cinnamate of a hydroxy group-containing polymer.

10. The presensitized plate of claim 9 wherein said photodimerizable resin is a light-sensitive polyester derived from cinnamylidene malonic acid and a bifunctional glycol.

11. The presensitized plate of claim 9 wherein said photodimerizable resin is a cinnamate of a hydroxy group-containing polymer selected from the group consisting of polyvinyl alcohol, starch, and cellulose.

12. The presensitized plate of claim 1, wherein the reactive silane compound is represented by the formula:

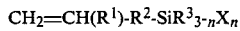

wherein $R^1$ represents a hydrogen atom or an alkyl group having 1 to 3 carbon atoms, $R^2$ represents a bivalent linkage group comprising one or more carbon, oxygen or nitrogen atoms, $R^3$ represents an alkyl group having 1 to 3 carbon atoms or a phenyl group, X represents a hydrolyzable group represented by the formula: —$OR^4$, —$OCOR^4$, $$-ON=\underset{R^5}{C}-R^4, \quad -\underset{R^5}{N}-R^4 \quad \text{or} \quad -O\underset{R^5}{C}=CH_2,$$

wherein $R^4$ and $R^5$ may be the same or different and represent substituted or unsubstituted alkyl group, and n is an integer of 0 to 3.

* * * * *